(12) United States Patent
Sparling et al.

(10) Patent No.: US 7,154,196 B2
(45) Date of Patent: Dec. 26, 2006

(54) PRINTED CIRCUIT BOARD FOR A THREE-PHASE POWER DEVICE HAVING EMBEDDED DIRECTIONAL IMPEDANCE CONTROL CHANNELS

(75) Inventors: Larry A. Sparling, Mundelein, IL (US); Scott W. Repplinger, Lake Zurich, IL (US); Eugene L. Wineinger, Carol Stream, IL (US)

(73) Assignee: Motorola, Inc., Schaumburg, IL (US)

( * ) Notice: Subject to any disclaimer, the term of this patent is extended or adjusted under 35 U.S.C. 154(b) by 630 days.

(21) Appl. No.: 10/721,030

(22) Filed: Nov. 24, 2003

(65) Prior Publication Data

US 2005/0035816 A1 Feb. 17, 2005

Related U.S. Application Data

(60) Provisional application No. 60/485,874, filed on Jul. 9, 2003.

(51) Int. Cl.
*H01B 7/30* (2006.01)
(52) U.S. Cl. .................................................. 307/147
(58) Field of Classification Search ................ 307/147
See application file for complete search history.

(56) References Cited

U.S. PATENT DOCUMENTS

| 5,546,321 | A | 8/1996 | Chang et al. |
| 5,641,944 | A | 6/1997 | Wieloch et al. |
| 5,682,298 | A | 10/1997 | Raynham |
| 5,912,809 | A | 6/1999 | Steigerwald et al. |
| 6,046,653 | A | 4/2000 | Yamada |
| 6,072,699 | A * | 6/2000 | Horine .................... 361/777 |
| 6,356,162 | B1 | 3/2002 | DeFlandre et al. |
| 6,440,318 | B1 | 8/2002 | Lee et al. |
| 6,462,976 | B1 | 10/2002 | Olejniczak et al. |
| 7,012,811 | B1 * | 3/2006 | Jiang et al. .................. 361/777 |
| 2004/0061241 | A1 * | 4/2004 | Osburn et al. .............. 257/786 |

* cited by examiner

*Primary Examiner*—Robert L. Deberadinis
(74) *Attorney, Agent, or Firm*—Thomas V. Miller; Gary J. Cunningham (57) ABSTRACT

A printed circuit board having a first switching device (S1 or S2), a second switching device (S3 or S4), a third switching device (S5 or S6), and a common source node (26 or 166) that are each mounted to a surface of the printed circuit board (50 or 150). The printed circuit board further includes at least a first set of conductive paths in a first layer, a second set of conductive paths in a second layer, and a plurality of vias that connects the first layer to the second layer. The first set of conductive paths provides electrical conductivity between the common source node, the first switching device, the second switching device, and third switching device. The second set of conductive paths in the second layer provides electrical conductivity between the common source node, the first switching device, and the third switching device. The physical distance between the first low side switching device and the common source node and the distance between the third low side switching device and the common source node is greater than a distance between the second low side switching device and the common source node.

42 Claims, 10 Drawing Sheets

| S1, S2 | S3, S4 | S5, S6 | i_dc_link | VECTOR |
|---|---|---|---|---|
| S1 = CLOSED<br>S2 = OPEN | S3 = OPEN<br>S4 = CLOSED | S5 = OPEN<br>S6 = CLOSED | $i\_a$ | V1 |
| S1 = CLOSED<br>S2 = OPEN | S3 = CLOSED<br>S4 = OPEN | S5 = OPEN<br>S6 = CLOSED | $-i\_c$ | V2 |
| S1 = OPEN<br>S2 = CLOSED | S3 = CLOSED<br>S4 = OPEN | S5 = OPEN<br>S6 = CLOSED | $i\_b$ | V3 |
| S1 = OPEN<br>S2 = CLOSED | S3 = CLOSED<br>S4 = OPEN | S5 = CLOSED<br>S6 = OPEN | $-i\_a$ | V4 |
| S1 = OPEN<br>S2 = CLOSED | S3 = OPEN<br>S4 = CLOSED | S5 = CLOSED<br>S6 = OPEN | $i\_c$ | V5 |
| S1 = CLOSED<br>S2 = OPEN | S3 = OPEN<br>S4 = CLOSED | S5 = CLOSED<br>S6 = OPEN | $-i\_b$ | V6 |
| S1 = CLOSED<br>S2 = OPEN | S3 = CLOSED<br>S4 = OPEN | S5 = CLOSED<br>S6 = OPEN | $i\_0$ offset | V0 |
| S1 = OPEN<br>S2 = CLOSED | S3 = OPEN<br>S4 = CLOSED | S5 = OPEN<br>S6 = CLOSED | $i\_0$ offset | V7 |

PRINTED CIRCUIT BOARD FOR A THREE-PHASE POWER DEVICE HAVING EMBEDDED DIRECTIONAL IMPEDANCE CONTROL CHANNELS

The present application claims priority from provisional application Ser. No. 60/485,874, entitled "Printed Circuit Board for a Three-Phase Power Device Having Embedded Directional Impedance Control Channels," filed Jul. 9, 2003, which is commonly owned and incorporated by reference in its entirety.

FIELD OF THE INVENTION

This invention in general relates to three-phase power devices (such as three-phase motors) and, more particularly, to a switching circuit mounted on a printed circuit board having embedded directional impedance control channels.

BACKGROUND OF THE INVENTION

A three-phase motor (such as a permanent magnet synchronous motor and induction motor) is used in automotive applications such as power steering systems. It is known to control the phase windings in a three-phase motor using pulse width modulated signals. The pulse width modulated signals are applied to an inverter or a series of switching devices that connect the phase windings of the motor to either a positive or negative (ground) terminal of the vehicle battery.

In particular, a series of switching devices are usually part of a switching circuit that drive the three-phase motor. A current sensor is used to help determine and track the voltages being applied to each phase winding of the motor. In the past, the switching circuit and current sensor have been mounted on a ceramic substrate. A series of wire bonds are used to interconnect the switching devices and components. The use of wire bonds and a ceramic substrate, however, is expensive and there is a need for less expensive materials and designs.

It would be beneficial to use a printed circuit board to mount and interconnect the switching devices, such as a printed circuit board made of an epoxy glass known as FR4. This would allow a manufacturer to use a Field Effect Transistor (FET) in the form of a surface mounted power device. It would also be beneficial to eliminate the need of wire bonds. This would reduce the cost of implementing the system by eliminating cycle time, factory automation equipment, and maintenance cost associated with traditional wire bond methods.

It has been found, however, that applying a system to a printed circuit board generates problems. For instance, a system that applies sinusoidal drive signals to a three-phase motor is subject to a phenomenon known as torque ripple. Torque ripple can be characterized as harmonics (distortion) in the sinusoidal motor drive voltages that are created when the voltage loss from phase to phase is not balanced. These torque ripple harmonics generate undesirable problems. For instance, consider a three-phase motor used in a power steering application in an automobile. A driver of the automobile will feel any torque ripple harmonics in the form of small but repetitive oscillations while turning the steering wheel. This is an undesirable condition to automobile drivers and a need exists for eliminating, or at least substantially reducing, the effect of torque ripple harmonics.

Accordingly, a need exists to reduce the cost of implementing a three-phase control system yet solves other problems associated with torque ripple harmonics. The present invention addresses ways to solve this need. In particular, the present invention solves the problem of torque ripple harmonics when applying the three-phase motor control circuitry in a printed circuit board layout. This is accomplished by providing a mechanism to optimize, or otherwise balance, the resistive and reactive impedances that occur when applying the three-phase motor control circuitry in a printed circuit board layout.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a design for implementing a switching circuit for a three-phase power device on a printed circuit board. The present invention uses embedded directional impedance control channels to balance the resistive and reactive impedance that occur when applying the switching circuit in a printed circuit board application. For purposes of illustration and description, an example of an application for a three-phase motor for automotive uses will be used. Three-phase motors, such as permanent magnet synchronous motors, may be used as part of a power steering system in an automobile. The present invention, however, is not limited to three-phase motors for automobiles and may be applicable to other three-phase devices.

To this end, generally, there is a printed circuit board for a three-phase power device. The printed circuit board has a first switching device, a second switching device, a third switching device, and a common source node that are each mounted to a surface of the printed circuit board. The printed circuit board further includes at least a first set of conductive paths in a first layer, a second set of conductive paths in a second layer, and a plurality of vias that connects the first layer to the second layer. The first set of conductive paths provides electrical conductivity between the common source node, the first switching device, the second switching device, and third switching device. The second set of conductive paths in the second layer provide electrical conductivity between the common source node, the first switching device, and the third switching device. In this embodiment, the physical distance between the first low side switching device and the common source node and the distance between the third low side switching device and the common source node is greater than a distance between the second low side switching device and the common source node.

The present invention may be applied to a set of low side switching device and/or to a set of high side switching devices. Accordingly, in one embodiment, the switching devices are low side switching devices and the common source node may include a current sensor. In another embodiment, the switching devices are high side switching devices and the common source node may include a power source node.

In a further embodiment, there is a printed circuit board for a three-phase power device that has at least a first low side switching device, a second low side switching device, a third low side switching device, and a current sensor that are each mounted to a surface of the printed circuit board. The printed circuit, in one embodiment, has a first set of conductive paths in a first layer, a second set of conductive paths in a second layer, and a plurality of vias. The first set of conductive paths in the first layer of the printed circuit board provides electrical conductivity between the low side switching devices and the current sensor. The second set of conductive paths in the second layer of the printed circuit board provides electrical conductivity between the first low side switching device and the third low side switching device and the current sensor. The plurality of vias connect the first layer to the second layer of the printed circuit board. In this embodiment, the physical distance between the first low side switching device and the current sensor and the distance between the third low side switching device and the current sensor is greater than a distance between the second low side switching device and the current sensor. The printed circuit board may further have a third set of conductive paths in a third layer and a second plurality of vias. The third set of conductive paths in the third layer provides electrical conductivity between the first low side switching device and the third low side switching device.

In another embodiment, there is a printed circuit board for a three-phase power device having a switching circuit and a current sensor mounted on a surface of the printed circuit board. The switching circuit has three sets of switching devices where each set includes a high side switching device and a low side switching device. The printed circuit board comprises a first set of conductive paths in a first layer, a second set of conductive paths in a second layer, and a plurality of vias. The first set of conductive paths in the first layer of the printed circuit board provides electrical conductivity between each of the low side switching devices in the switching circuit and the current sensor. The second set of conductive paths in the second layer of the printed circuit board provides electrical conductivity between at least two of the low side switching devices of the switching circuit and the current sensor. The plurality of vias connects the first layer of the printed circuit board to the second layer of the printed circuit board. The second conductive paths assist in substantially balancing impedances between the low side switching devices of the switching circuit and the current sensor. The printed circuit board may further have a third set of conductive paths in a third layer and a second plurality of vias. The third set of conductive paths in the third layer provides electrical conductivity between at least two of the low side switching devices of the switching circuit.

There is also a printed circuit board for a three-phase power device that has at least a first low side switching device, a second low side switching device, a third low side switching device, and a current sensor, each mounted to a surface of the printed circuit board. Here, the printed circuit board comprises a first set of conductive paths in a first layer, a second set of conductive paths in a second layer, a third set of conductive paths in a third layer, and a first and second set of vias. The first set of conductive paths in the first layer of the printed circuit board provides electrical conductivity between the low side switching devices and the current sensor. The second set of conductive paths in the second layer of the printed circuit board provides electrical conductivity between the first low side switching device, the third low side switching device and the current sensor. The third set of conductive paths in the third layer of the printed circuit board provides electrical conductivity between the first low side switching device and the third low side switching device. The first set of vias connect the first layer of the printed circuit board to the second layer of the printed circuit board. The second set of vias connect the first layer of the printed circuit board to the third layer of the printed circuit board.

In yet another embodiment, there is a printed circuit board that has a power source node, a first high side switching device, a second high side switching device, and a third high side switching device that are each mounted on the printed circuit board. The printed circuit board further includes at least a first set of conductive paths in a first layer, a second set of conductive paths in a second layer, and a plurality of vias that connect the first layer to the second layer. Here, the first set of conductive paths in the first layer provide electrical conductivity between the power source node, the first high side switching device, the second high side switching device, and the third high side switching device. The second set of conductive paths in the second layer provide electrical conductivity between the power source node, the first high side switching device, and the third high side switching device. The physical distance between the power source node and the first high side switching device and the distance between the power source node and the third high side switching device is greater than a distance between the power source node and the second high side switching device.

Figure 1:
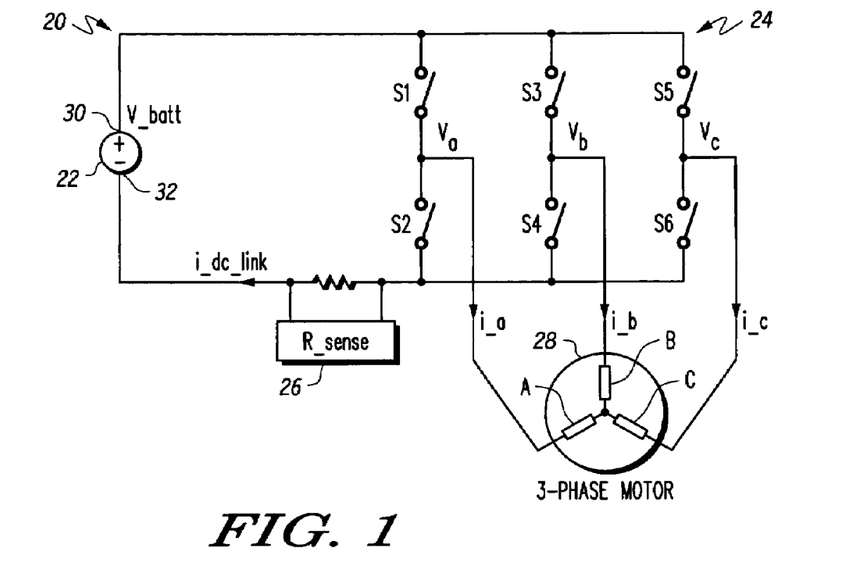
FIG. 1 is a diagram of a system that could utilize the embodiments of the present invention, the system having a power source, an inverter or switching circuit, and a three-phase motor.

Now, turning to the drawings, an example use of a system for a three-phase motor in an automotive application will be explained. Referring to FIG. 1, there is a system 20 having generally a power source 22, an inverter or switching circuit 24, a current sensor 26, and a motor 28. For automotive use, the power source 22 may be an automobile DC battery having a positive terminal 30 and a negative terminal 32. The negative terminal 32 may also be a ground connection. The motor 28 may be a motor having three phase windings A, B, C in a star connection, although other connection types may be used such as a delta connected motor. Such motors may include, for example, a permanent magnet synchronous motor or an induction motor.

The inverter or switching circuit 24 and the current sensor may be mounted on a surface of a printed circuit board, as will be explained in more detail below. The inverter or switching circuit 24 includes three sets of switching devices, one set for each phase winding of the motor 28. A first set of switching devices S1, S2 are capable of providing a first voltage $V_a$ to the first phase winding A. A second set of switching devices S3, S4 are capable of providing a second voltage $V_b$ to the second phase winding B. A third set of switching devices S5, S6 are capable of providing a third voltage $V_c$ to the third phase winding C.

In one embodiment, each set of switching devices has a high side switching device S1, S3, S5 connected to the positive terminal 30 of the power source 22 and a low side switching device S2, S4, S6 connected to the negative terminal 32 of the power source 22 (or a ground connection). Each switching device within a set is complimentary to the other switch within the same set. For example, when the high side switching device S1 of the first set of switching devices S1, S2 is closed, the corresponding low side switching device S2 within the first set of switching devices S1, S2 is open. Similarly, when the high side switching device S1 of the first set of switching devices S1, S2 is open, the corresponding low side switching device S2 within the first set of switching devices S1, S2 is closed.

By having complementary switching devices, the opening and closing of switching devices within each set allows each phase winding A, B, C of the motor 28 to be connected to a positive terminal 30 or a negative terminal 32 (or ground) of the power supply 22. This permits a voltage $V_a$, $V_b$, or $V_c$ to be applied to a corresponding phase winding A, B, or C of the motor 28, respectively. The current flowing through each phase winding A, B, or C is represented in FIG. 1 by a corresponding variable i_a, i_b, or i_c, respectively.

As will be explained in more detail below, in one embodiment, the switching devices S1–S6 may be field effect transistors (FETs), each having a source terminal, a drain terminal, and a gate terminal. The FET can be used as a switch by raising and lowering the voltage applied to the gate terminal above and below a threshold value. Applying a voltage above a threshold value will allow current to pass through a switching device S1–S6. Other suitable types of devices exist for the switching devices S1–S6 such as power transistors like IGBT, power MOSFET, and bipolar.

Figure 2:
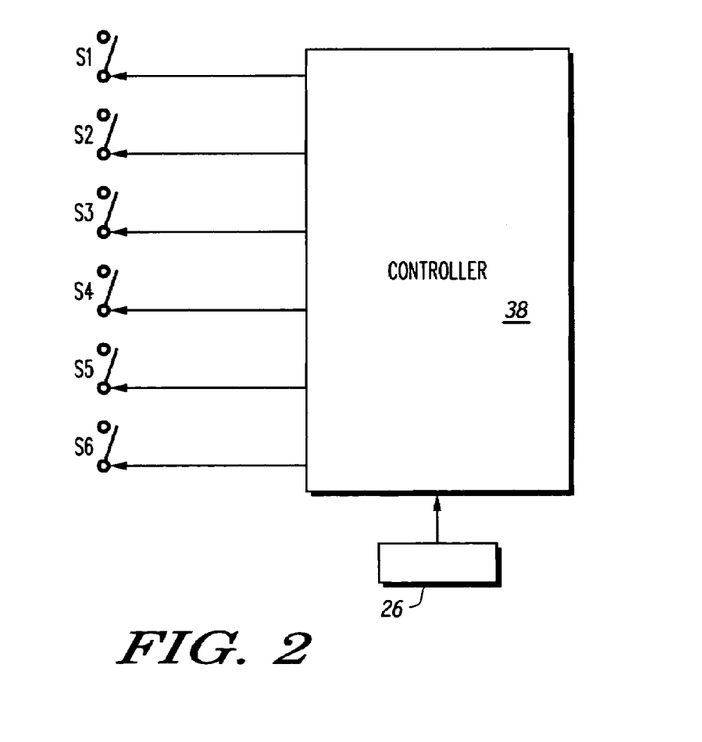
FIG. 2 is a diagram of a controller for the system in FIG. 1 for generating signals to a plurality of switching devices.

Pulse width modulated (PWM) signals may be used to control the switching devices S1–S6. Referring to FIG. 2, a controller 36 is used to generate a PWM signal to each of the switching devices S1–S6. The controller 36 generates the PWM signal based on the current measurements provided by the current sensor 26. The controller 36 may include a digital processor and memory to store software having control algorithms. The digital processor supplies the PWM signals based the control algorithms implemented in software. A suitable controller 36 may include a DSP processor and memory (not shown).

Referring back to FIG. 1, to adequately control the motor 28, the currents for variables i_a, i_b, i_c need to be measured or otherwise known. In one embodiment, the current sensor 26 is positioned on the DC link between the power supply 22 and the switching circuit 24. In particular, the current sensor 26 is located between the low side switching devices S2, S4, S6 of the switching circuit 24 and the negative terminal 30 of the power supply 22. The current sensor 26 may also be positioned between the low side switching devices S2, S4, S6 of switching circuit 24 and a ground connection. In either event, the current sensor 26 is electrically connected to the low side switching devices S2, S4, S6 of the switching circuit 24. The present invention is directed to balancing the resistive and reactive impedances in this electrical connection when the switching circuit 24 and the current sensor 26 are implemented on, or mounted to, a surface of a printed circuit board.

The current sensor 26 may be a sensor that measures the voltage drop across a resistor. The current sensor 26 may be capable of converting the measured voltage drop to a current (represented by i_dc_link) through the DC link according to well-known methods. Alternatively, the measured voltage drop from sensor 26 may be provided to the controller 36 and the controller 36 may convert the sensed voltage drop to a current.

Figure 3:
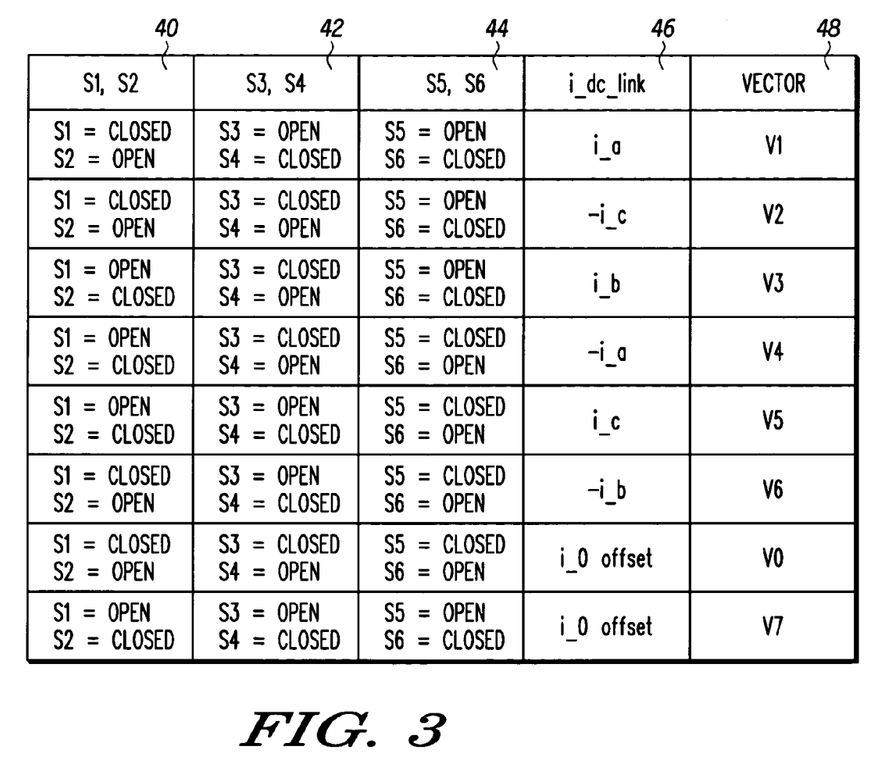
FIG. 3 is a table reflecting the eight possible switching states for a three-phase power device.

As explained above, each switching device within a set of switching devices is complementary to the other switching device. For a three-phase motor system, this results in eight possible switching states. The table illustrated in FIG. 3 reflects the eight possible switching states as vectors V0–V7. The first column 40 in the table represents the states (open/closed) of the first set of switching devices S1, S2. The second column 42 in the table represents the states (open/closed) of the second set of switching devices S3, S4. The third column 44 in the table represents the states (open/closed) of the third set of switching devices S5, S6. The fourth column 46 reflects the relationship between the current through the DC link (i_dc_link) and the currents i_a, i_b, and i_c through the various phase windings A, B, and C. The fifth column 48 reflects the eight vector states. Out of the eight possible switching states, there are six active vector states (V1–V6) where current will flow through the DC link and two zero vector states (V0, V7) where no current will flow through the DC link.

As mentioned above, the application of sinusoidal drive voltages to a three-phase power device, such as a motor, is subject to torque ripple harmonics. The problem of torque ripple harmonics needs to be addressed when attempting to implement the switching circuit 24 and the current sensor 26 in a printed circuit board layout. It has been found that torque ripple harmonics will result when resistive and reactive impedances are not balanced. The present invention addresses ways to eliminate, or at least substantially reduce, the effect of the torque ripple harmonics.

Figure 4:
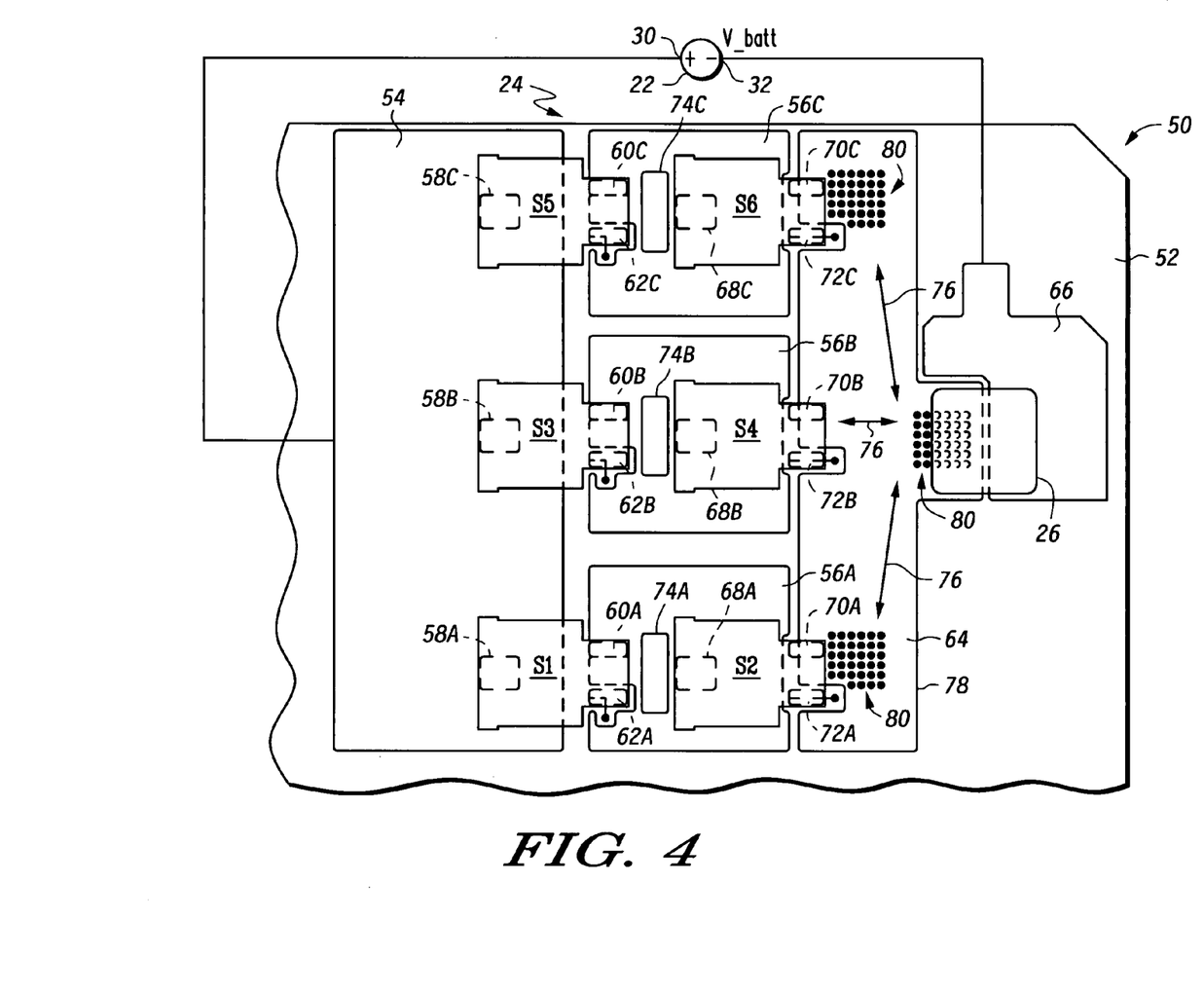
FIG. 4 is top view of one embodiment of a switching circuit and current sensor mounted on a printed circuit board.

Referring to FIG. 4, there is shown a printed circuit board 50 for a three-phase power device, such as the motor 28 described above. The printed circuit board 50 has a switching circuit 24 and a current sensor 26 mounted on a surface 52 of the printed circuit board 50. The switching circuit 24 has three sets of switching devices. Each set of switching devices has a high side switching device S1, S3, S5 and a low side switching device S2, S4, S6.

In this embodiment, the positive terminal 30 of the power source 22 is connected to the high side switching devices S1, S3, S5 through a power supply conductive pad 54. The power supply conductive pad 54 may actually supply power to the high side switching devices S1, S3, S5 through multiple layers in the printed circuit board. This may be important if the current required to drive the three-phase power device is relatively high. The multiple layers may be electrically tied together through vias (not shown).

Each set of switching devices is connected to each other through a series of interconnecting pads 56A, 56B, 56C. For instance, a first interconnecting pad 56A provides electrical contact between a first high side switching device S1 and a first low side switching device S2. A second interconnecting pad 56B provides electrical contact between a second high side switching device S3 and a second low side switching device S4. A third interconnecting pad 56C provides electrical contact between a third high side switching device S5 and a third low side switching device S6.

In one embodiment, where the high side switching devices S1, S3, S5 are field effect transistors (FETs), each device has three terminals including a drain terminal 58A, 58B, 58C, a source terminal 60A, 60B, 60C, and a gate terminal 62A, 62B, 62C. The drain terminals 58A, 58B, 58C of the high side switching devices S1, S3, S5 may be connected to the power supply conductive pad 54. The source terminals 60A, 60B, 60C may be connected to the interconnecting pads 56A, 56B, 56C. And, the gate terminals 62A, 62B, 62C may be electrically connected to a controller 38 (not shown) for control purposes.

The low side switching device S2, S4, S6 may be connected to the current sensor 26 by a set of conductive paths 76 through a common conductive pad 64. Here, the common conductive pad 64 may be part of a first conductive copper layer 78 of the printed circuit board 50 between the low side switching devices S2, S4, S6 and the current sensor 26. In an embodiment where the low side switching devices S2, S4, S6 are field effect transistors (FETs), each device has three terminals including a drain terminal 68A, 68B, 68C, a source terminal 70A, 70B, 70C, and a gate terminal 72A, 72B, 72C. The drain terminals 68A, 68B, 68C of the high side switching devices S2, S4, S6 may be connected to the interconnecting pads 56A, 56B, 56C. The source terminals 70A, 70B, 70C may be connected to the common conductive pad 64. And, the gate terminals 72A, 72B, 72C may be electrically connected to a controller 38 (not shown) for control purposes.

The low side switching device S2, S4, S6 (through the current sensor 26) may be connected to the negative terminal 32 of the power source 22 through a conductive pad 66. Alternatively, the current sensor 26 may be connected to ground through the same conductive pad 66. The connection to the negative terminal 32, or ground connection, may be fed through multiple layers in the printed circuit board. This, again, may be important if the current required to drive the three-phase power device is relatively high. The multiple layers may be electrically tied together through vias (not shown).

Each switching device within a set is complimentary to the other switch within the same set. For example, as mentioned above, when the high side switching device S1 of the first set of switching devices S1, S2 is closed, the corresponding low side switching device S2 within the first set of switching devices S1, S2 is open. Similarly, when the high side switching device S1 of the first set of switching devices S1, S2 is open, the corresponding low side switching device S2 within the first set of switching devices S1, S2 is closed.

By having complementary switching devices, the opening and closing of switching devices within each set allows each phase winding A, B, C of the motor 28 to be connected to a positive terminal 30 or a negative terminal 32 (or ground) of the power supply 22. This is accomplished by having a first terminal 74A connected between the first high side switching device S1 and the first low side switching device S2, a second terminal 74B connected between the second high side switching device S3 and the second low side switching device S4, and a third terminal 74C connected between the third high side switching device S5 and the third low side switching device S6. The terminals 74A, 74B, 74C permit a voltage $V_a$, $V_b$, or $V_c$ to be applied to a corresponding phase winding A, B, or C of the motor 28, respectively. The current flowing through each phase winding A, B, or C is represented in FIG. 1 by a corresponding variable i_a, i_b, or i_c, respectively.

The layout of the connection between the positive terminal 30 of the power source 22 and the high side switching devices S1, S3, S5 and the connection between the current sensor 26 and the negative terminal 32 of the power source 22 (or ground) should be highly symmetric and balanced, both physically and electrically. However, in a printed circuit board layout, it is not possible to make the connection between the low side switching devices S2, S4, S6 and the current sensor 26 geometrically symmetric. Moreover, the connection between the low side switching devices S2, S4, S6 themselves are not geometrically symmetric. One aspect of the present invention, as described further below, is directed to mechanisms in making these connections electrically symmetric and balanced to avoid problems associated with torque ripple harmonics.

In the design layout shown in FIG. 4, the physical distance between the source terminal 70A of the first low side switching device S2 and the current sensor 26 is greater than the physical distance between the source terminal 70B of the second low side switching device S4 and the current sensor 26. Also, the physical distance between the source terminal 70C of the third low side switching device S6 and the current sensor 26 is greater than the physical distance between the source terminal 70B of the second low side switching device S4 and the current sensor 26. Left with only the common conductive pad 64 as the electrically connecting member, it has been found that unacceptable torque ripple harmonics will occur during the operation of a three-phase power device.

Figure 5:
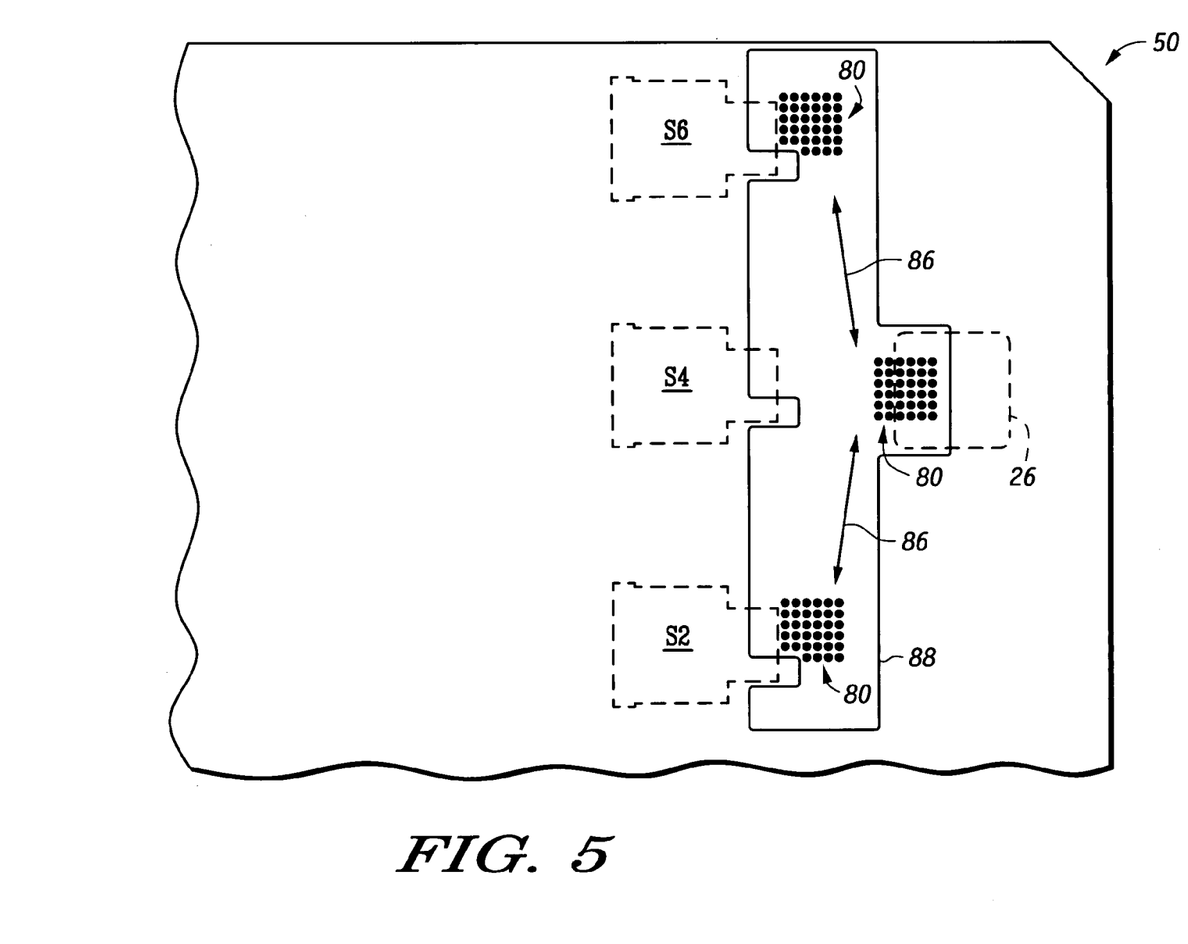
FIG. 5 is top view of one embodiment of an embedded second layer of the printed circuit board in FIG. 4.

To solve this problem, in one embodiment, a first set of vias 80 and a second set of conductive paths 86 in an embedded second conductive copper layer 88 of the printed circuit board 50 (as shown in FIG. 5) are added to the design. Moreover, the distance between the source terminal 70A of the first low side switching device S2 and the current sensor 26 is set to about twice the distance between the source terminal 70B of the second low side switching device S4 and the current sensor 26. Moreover, the distance between the source terminal 70A of the first low side switching device S2 and the current sensor 26 is set to about twice the distance between the source terminal 70B of the second low side switching device S4 and the current sensor 26.

The physical distances between the low side switching devices S2, S4, S6 and the current sensor 26 are directly proportional to circuit resistance and impedance. In the printed circuit board layout in FIG. 4, with only the common conductive pad 64, the voltage loss associated with the second low side switching device S4 would be less than the losses associated with the first and third low side switching devices S2, S6. The addition of the first set of vias 80 and the second conductive paths 86 in the second layer 88 of the printed circuit board 50 (as shown in FIG. 5) provides a more balanced set of electrical paths between the low side switching devices S2, S4, S6 and the current sensor 26. The first set of vias 80 stitches, or otherwise connects, the first layer 78 to the second layer 88. The first set of vias 80 should be placed at unique points or regions as shown in FIGS. 4–5. These points or regions are in proximity of the first low side switching device S2, the third low side switching device S6, and the current sensor 26.

Referring to FIG. 5, in effect, the use of the first set of vias 80 adds a second parallel current path between first low side switching device S2 and the current sensor 26 and between the third low side switching device S6 and the current sensor 26. This design helps eliminate, or at least substantially reduce, the effect of torque ripple harmonics.

Figure 6:
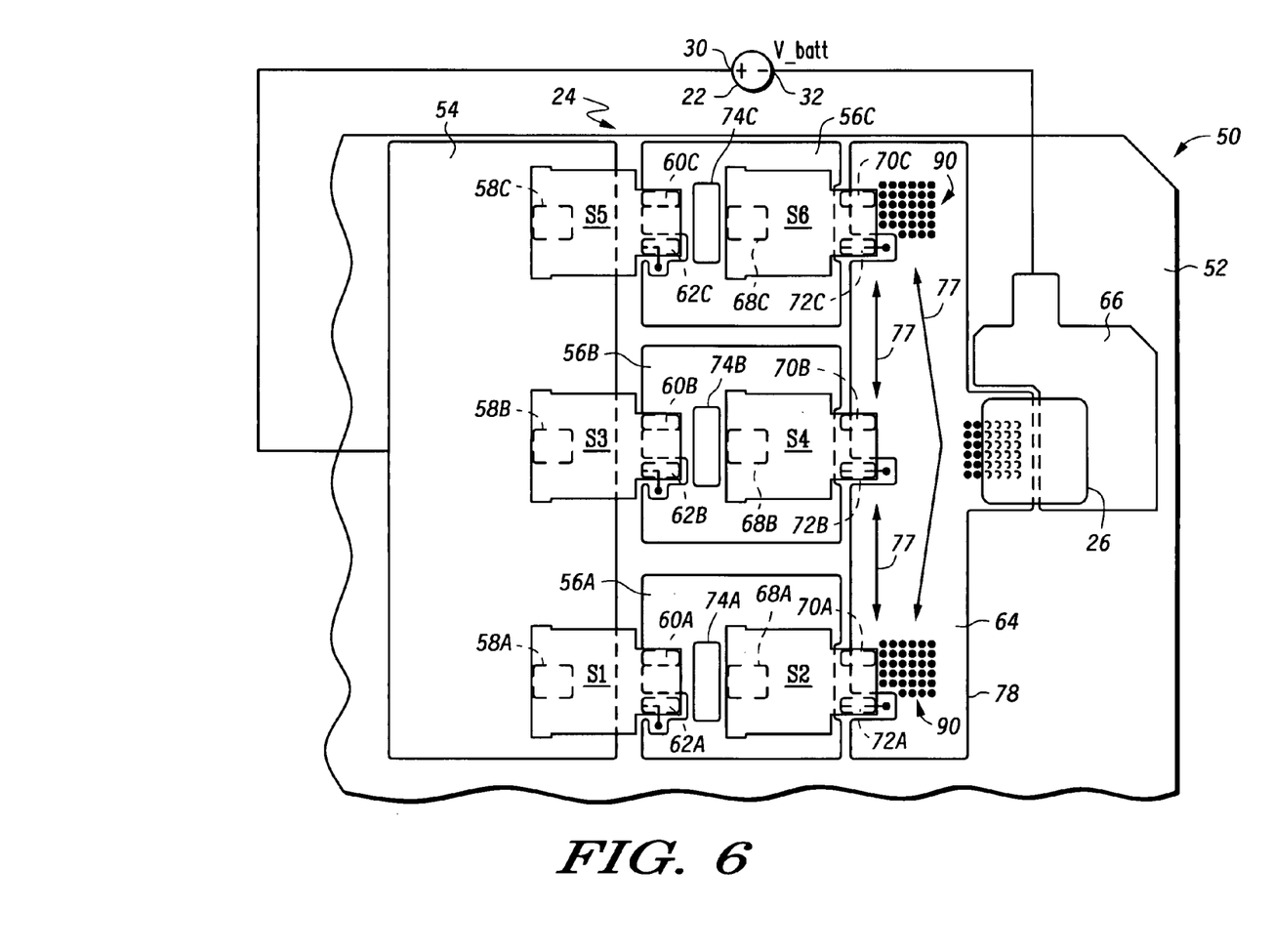
FIG. 6 is top view of one embodiment of a switching circuit and current sensor mounted on a printed circuit board.

Referring to the design layout in FIG. 6, the common conductive pad 64 also provides a first set of conductive paths 77 in the first layer 78 of the printed circuit board 50 when current is fed between the low side switching devices S2, S4, S6 themselves. It is noted that the physical distance between the source terminal 70A of the first low side switching device S2 and the source terminal 70C of the third low side switching device S6 is greater than the physical distance between the source terminal 70A of the first low side switching device S2 and the source terminal 70B of the second low side switching device S4. Also, the physical distance between the source terminal 70C of the third low side switching device S6 and the source terminal 70A of the first low side switching device S2 is greater than the physical distance between the source terminal 70C of the third low side switching device S6 and source terminal 70B of the second low side switching device S4. Again, left with only the common conductive pad 64 as the electrically connecting member, it has been found that unacceptable torque ripple harmonics will occur during the operation of a three-phase power device.

Figure 7:
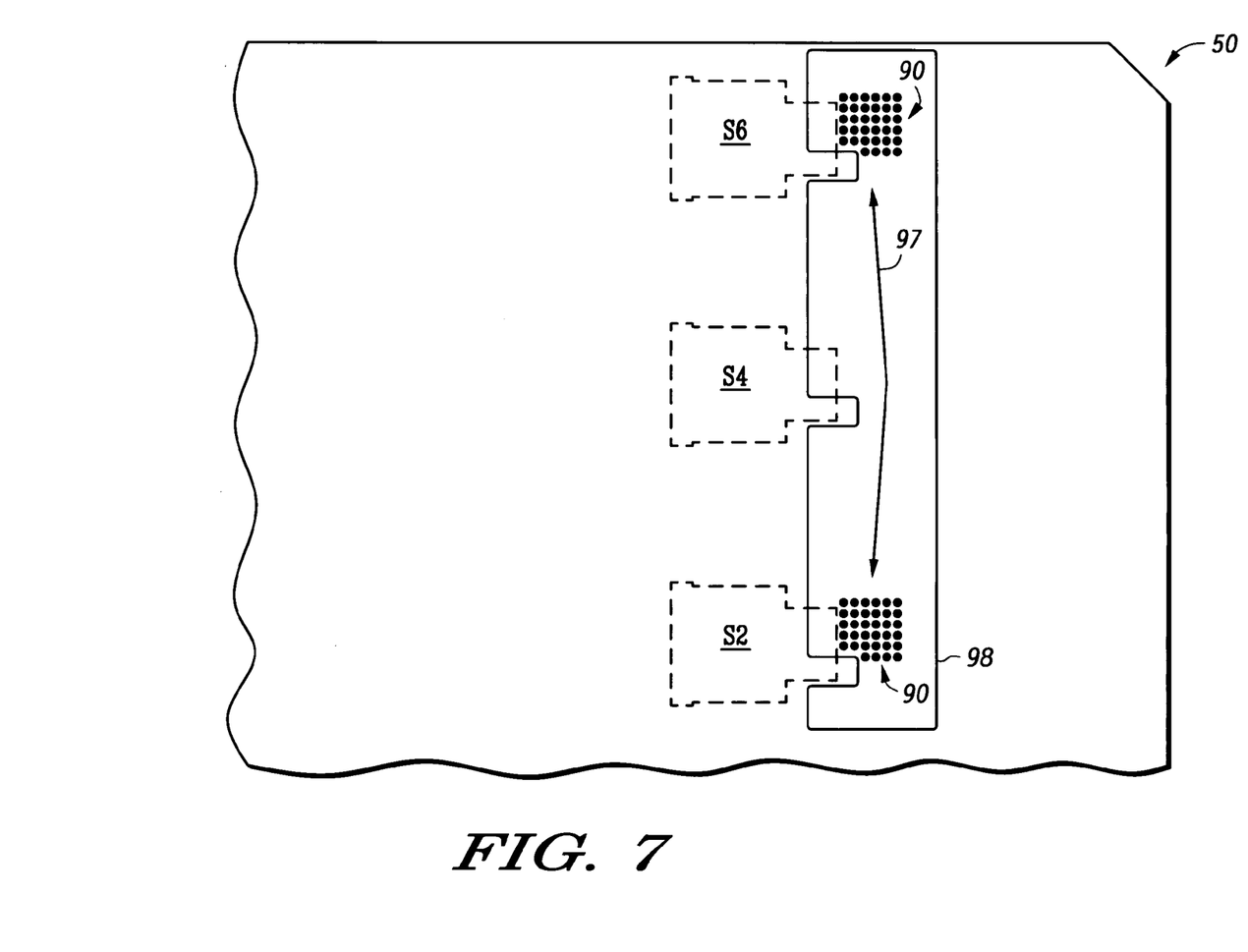
FIG. 7 is top view of one embodiment of an embedded third layer of the printed circuit board in FIG. 6.

To solve this problem, in one embodiment, a second set of vias 90 and a third set of conductive paths 97 in an embedded third conductive copper layer 98 of the printed circuit board 50 (as shown in FIG. 7) are added to the design. Moreover, the distance between the source terminal 70A of the first low side switching device S2 and source terminal 70C of the third low side switching device S6 is set to about twice the distance between the source terminal 70A of the first low side switching device S2 and the source terminal 70B of the second low side switching device S4. Moreover, the distance between the source terminal 70C of the third low side switching device S6 and the source terminal 70A of the first low side switching device S2 is set to about twice the distance between the source terminal 70C of the third low side switching device S6 and the source terminal 70B of the second low side switching device S4.

The physical distances between the low side switching devices S2, S4, S6 are directly proportional to circuit resistance and impedance. In the printed circuit board layout in FIG. 6, with only the common conductive pad 64, the voltage loss associated with current between some switching devices would be less than the losses associated between other switching devices. The addition of the second set of vias 90 and the third conductive paths 97 in the third layer 98 of the printed circuit board 50 (as shown in FIG. 7) provides a more balanced set of electrical paths between the low side switching devices S2, S4, S6. The second set of vias 90 stitches, or otherwise connects, the first layer 78 to the third layer 98. The second set of vias 90 must be placed at unique points or regions as shown in FIGS. 6–7. These points or regions are in proximity of the first low side switching device S2 and the third low side switching device S6.

Referring to FIG. 7, in effect, the use of the second set of vias 90 adds a second parallel current path between first low side switching device S2 and the third low side switching device S6. This design helps eliminate, or at least substantially reduce, the effect of torque ripple harmonics.

Figure 8:
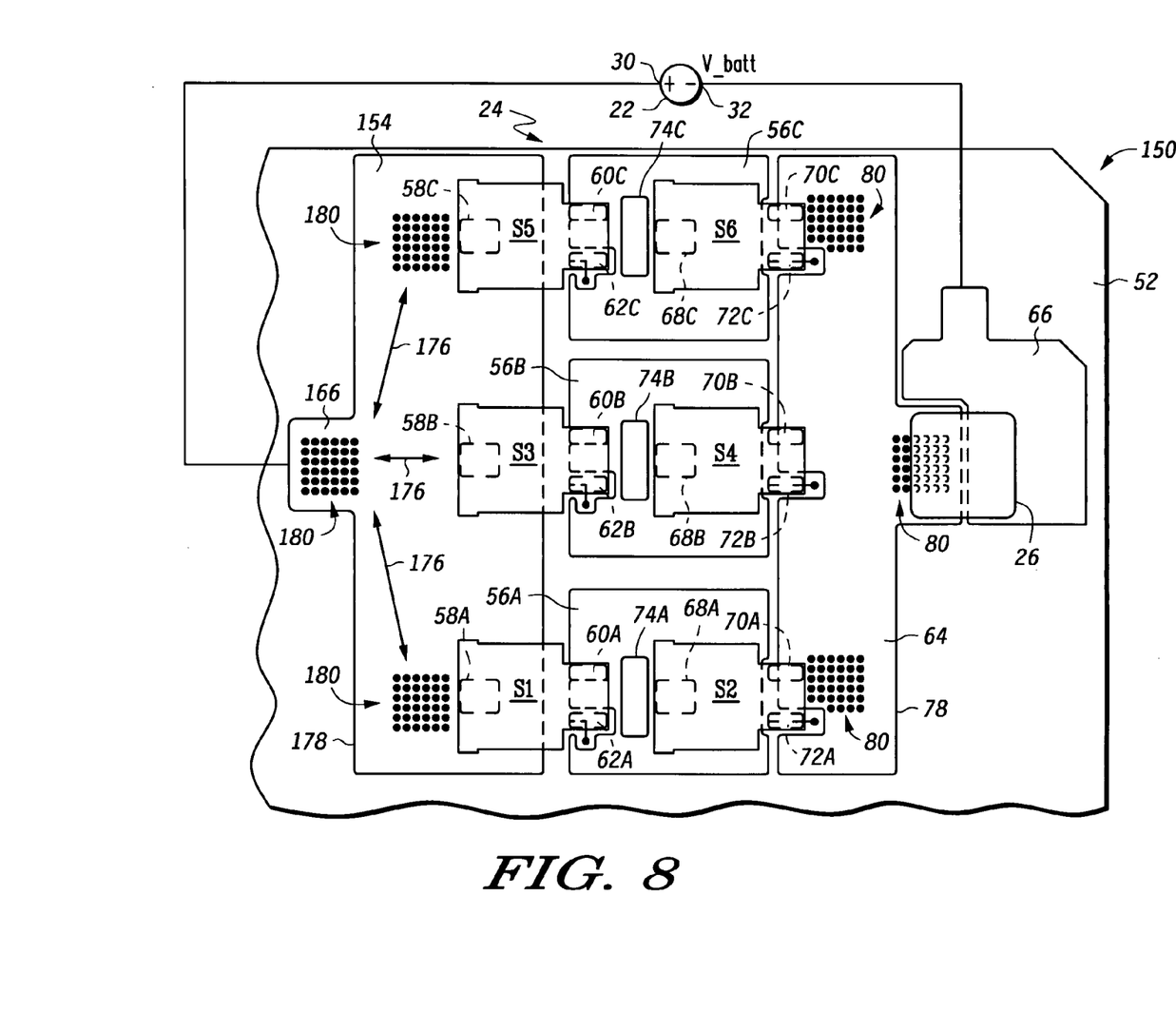
FIG. 8 is top view of another embodiment of a switching circuit and current sensor mounted on a printed circuit board.

FIG. 8 shows another embodiment where the present invention is applied to the high side switching devices S1, S3, S5. This embodiment addresses a potential need for current to funnel evenly out of one power source node, as well as evenly connect to each other when there are recirculating currents between any two of the switching devices. Accordingly, FIG. 8 shows a layout of the connection between the positive terminal 30 of the power source 22 and the high side switching devices S1, S3, S5 through a power source node 166 where the connection is not geometrically symmetric. An aspect of the present invention, as described further below, is directed to mechanisms in making these connections electrically symmetric and balanced to avoid problems associated with torque ripple harmonics.

In the design layout shown in FIG. 8, the physical distance between a power source node 166 and the first high side switching device S1 is greater than the physical distance between the power source node 166 and the second high side switching device S3. Also, the physical distance between the power source node 166 and the third high side switching device S5 is greater than the physical distance between the power source node 166 and the second high side switching device S3. Left with only a common conductive pad 154 as the electrically connecting member, unacceptable torque ripple harmonics may occur during the operation of a three-phase power device.

Figure 9:
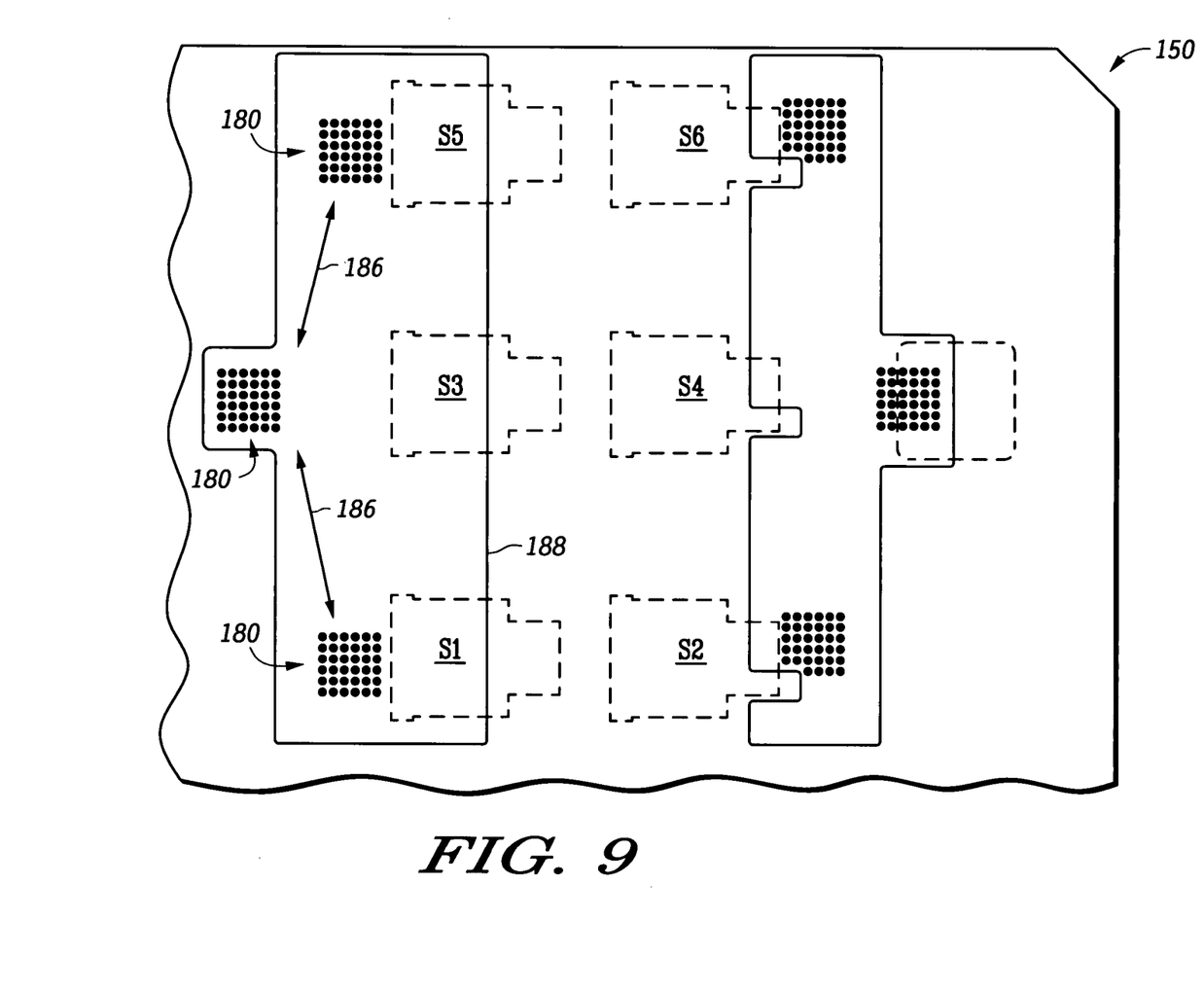
FIG. 9 is top view of another embodiment of an embedded second layer of the printed circuit board in FIG. 8.

To solve this problem, in one embodiment, a first set of vias 180 and a second set of conductive paths 186 in an embedded second conductive copper layer 188 of the printed circuit board 150 (as shown in FIG. 9) are added to the design. Moreover, the distance between the source node 166 and the first high side switching device S1 is set to about twice the distance between the source node 166 and the second high side switching device S3. Moreover, the distance between the source node 166 and the third high side switching device S5 is set to about twice the distance between the source node 166 and the second high side switching device S3.

The physical distances between the source node 166 and the high side switching devices S1, S3, S5 are directly proportional to circuit resistance and impedance. In the printed circuit board layout in FIG. 8, with only the common conductive pad 154, the voltage loss associated with the second high side switching device S3 would be less than the losses associated with the first and third high side switching devices S1, S5. The addition of the first set of vias 180 and the second conductive paths 186 in the second layer 188 of the printed circuit board 150 (as shown in FIG. 9) provides a more balanced set of electrical paths between the source node 166 and the high side switching devices S1, S3, S5. The first set of vias 180 stitches, or otherwise connects, the first layer 178 to the second layer 188. The first set of vias 180 should be placed at unique points or regions as shown in FIGS. 8–9. These points or regions are in proximity of the first high side switching device S1, the third high side switching device S5, and the source node 166.

Referring to FIG. 9, in effect, the use of the first set of vias 180 adds a second parallel current path between the source node 166 and the first high side switching device S1 and between the source node 166 and the third high side switching device S5. This design helps eliminate, or at least substantially reduce, the effect of torque ripple harmonics.

Figure 10:
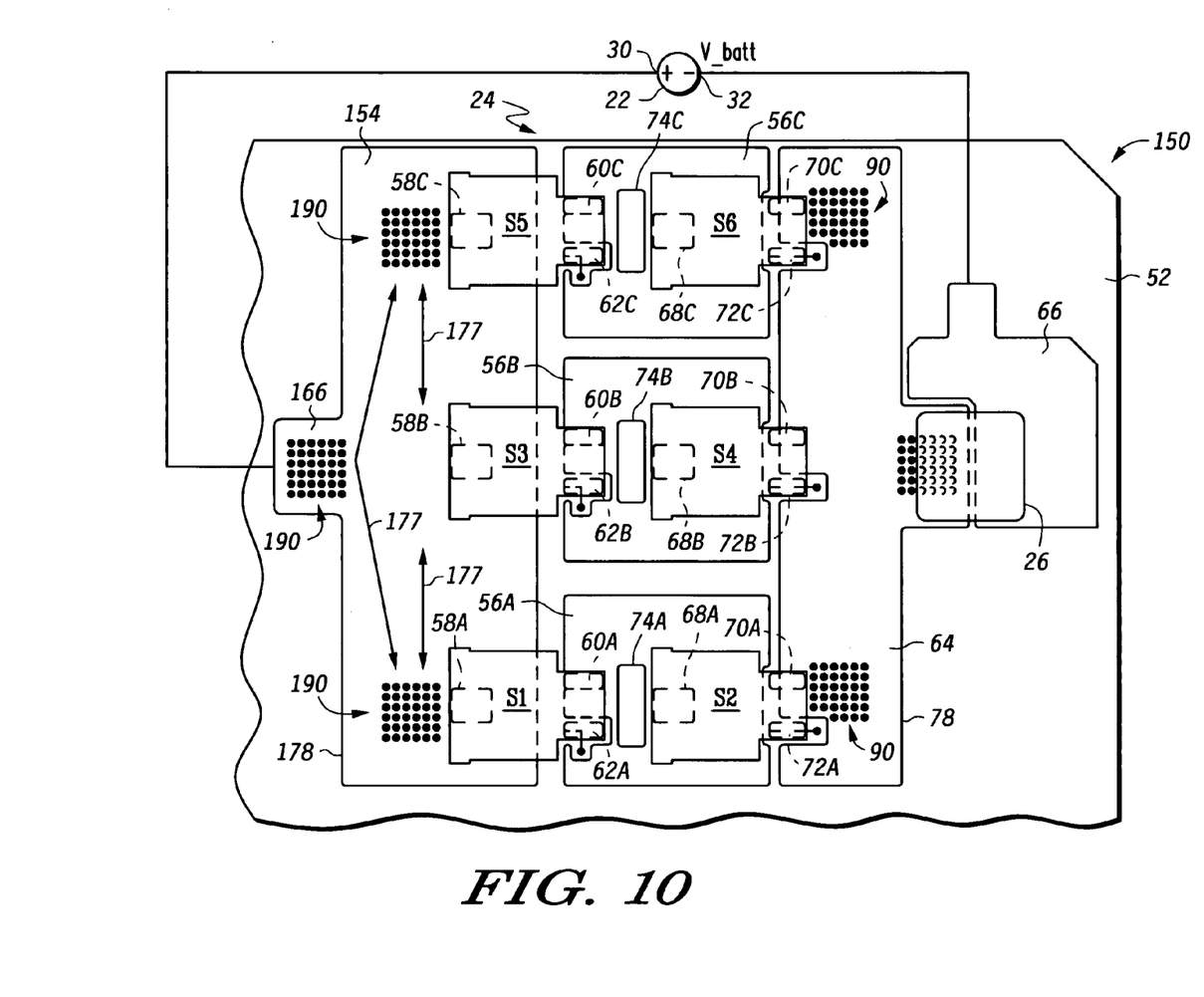
FIG. 10 is top view of another embodiment of a switching circuit and current sensor mounted on a printed circuit board.

Referring to the design layout in FIG. 10, the common conductive pad 154 also provides a first set of conductive paths 177 in the first layer 178 of the printed circuit board 150 when current is fed between the high side switching devices S1, S3, S5 themselves. It is noted that the physical distance between the drain terminal 58A of the first high side switching device S1 and the drain terminal 58C of the third high side switching device S5 is greater than the physical distance between the drain terminal 58A of the first high side switching device S1 and the drain terminal 58B of the second high side switching device S3. Also, the physical distance between the drain terminal 58C of the third high side switching device S5 and the drain terminal 58A of the first high side switching device S1 is greater than the physical distance between the drain terminal 58C of the third high side switching device S5 and drain terminal 58B of the second high side switching device S3. Again, left with only the common conductive pad 154 as the electrically connecting member, unacceptable torque ripple harmonics may occur during the operation of a three-phase power device.

Figure 11:
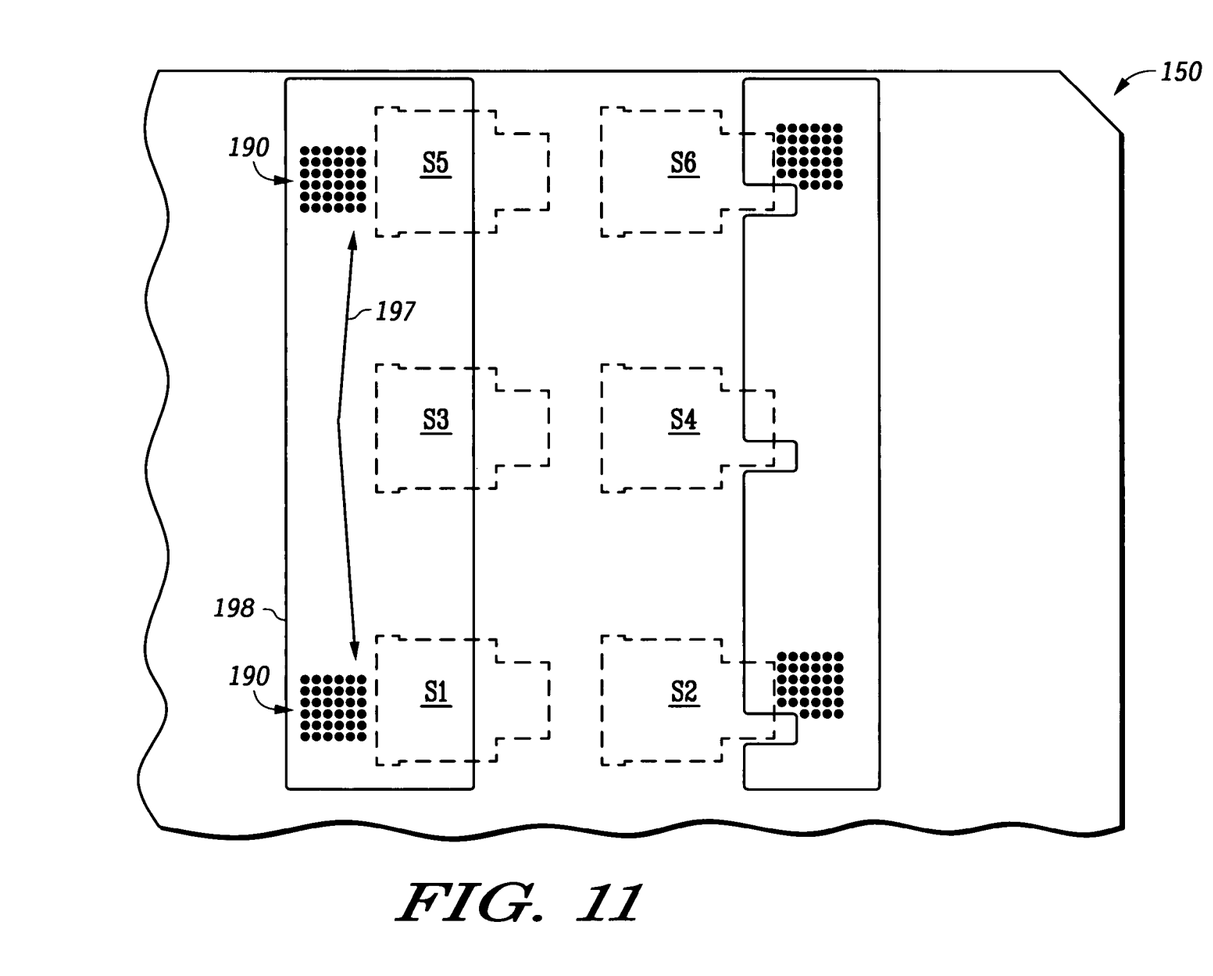
FIG. 11 is top view of another embodiment of an embedded third layer of the printed circuit board in FIG. 10.

To solve this problem, in one embodiment, a second set of vias 190 and a third set of conductive paths 197 in an embedded third conductive copper layer 198 of the printed circuit board 150 (as shown in FIG. 11) are added to the design. Moreover, the distance between the drain terminal 58A of the first high side switching device S1 and drain terminal 58C of the third high side switching device S5 is set to about twice the distance between the drain terminal 58A of the first high side switching device S1 and the drain terminal 58B of the second high side switching device S3. Moreover, the distance between the drain terminal 58C of the third high side switching device S5 and the drain terminal 58A of the first high side switching device S1 is set to about twice the distance between the drain terminal 58C of the third high side switching device S5 and the drain terminal 58B of the second high side switching device S3.

The physical distances between the high side switching devices S1, S3, S5 are directly proportional to circuit resistance and impedance. In the printed circuit board layout in FIG. 10, with only the common conductive pad 154, the voltage loss associated with current between some switching devices would be less than the losses associated between other switching devices. The addition of the second set of vias 190 and the third conductive paths 197 in the third layer 198 of the printed circuit board 150 (as shown in FIG. 11) provides a more balanced set of electrical paths between the high side switching devices S1, S3, S5. The second set of vias 190 stitches, or otherwise connects, the first layer 178 to the third layer 198. The second set of vias 190 must be placed at unique points or regions as shown in FIGS. 10–11. These points or regions are in proximity of the first high side switching device S1 and the third high side switching device S5.

Referring to FIG. 11, in effect, the use of the second set of vias 190 adds a second parallel current path between first high side switching device S1 and the third high side switching device S5. This design helps eliminate, or at least substantially reduce, the effect of torque ripple harmonics.

What has been described is an improved procedure for implementing a switching circuit and current sensor on a printed circuit board for three-phase power devices. The above-described system provides a way to optimize, or otherwise balance, the resistive and reactive impedances in the system. In particular, the printed circuit board has multiple conductive paths in embedded layers that serve as directional impedance control channels. This balance helps eliminate, or substantially reduce, the effects of torque ripple harmonics. The design is particularly important in automotive applications where a balanced system is needed to provide power to a three-phase motor for power steering. The present invention solves undesirable oscillations that may occur when a driver is turning the steering wheel.

The above description of the present invention is intended to be exemplary only and is not intended to limit the scope of any patent issuing from this application. For example, the present discussion used a three-phase motor for automobile applications. The present invention is also applicable to other three-phase devices where pulse width modulation is used. The present invention is intended to be limited only by the scope and spirit of the following claims.

What is claimed is:

1. A printed circuit board for a three-phase power device, the printed circuit board having at least a first switching device, a second switching device, a third switching device, and a common source node that are each mounted to a surface of the printed circuit board, the printed circuit board comprising:
   a first set of conductive paths in a first layer of the printed circuit board that provides electrical conductivity between the common source node, the first switching device, the second switching device, and the third switching device;
   a second set of conductive paths in a second layer of the printed circuit board that provides electrical conductivity between the common source node, the first switching device, and the third switching device; and
   a plurality of vias that connect the first layer of the printed circuit board to the second layer of the printed circuit board;
   wherein a distance between the common source node and the first switching device and a distance between the common source node and the third switching device is greater than a distance between the common source node and the second switching device.

2. The printed circuit board of claim 1 further comprising:
   a third set of conductive paths in a third layer of the printed circuit board that provides electrical conductivity between the first switching device and the third switching device; and
   a second plurality of vias that connect the first layer of the printed circuit board to the third layer of the printed circuit board.

3. The printed circuit board of claim 2 wherein a portion of the second plurality of vias is the same as the first plurality of vias.

4. The printed circuit board of claim 1 wherein the first switching device is a first low side switching device, the second switching device is a second low side switching device, and the third switching device is a third low side switching device.

5. The printed circuit board of claim 4 wherein the common source node comprises a current sensor.

6. The printed circuit board of claim 4 further having at least a first high side switching device, a second high side switching device, and a third high side switching device that are each mounted to a surface of the printed circuit board, the printed circuit board further comprising:
   a first terminal connected between the first high side switching device and the first low side switching device, the first terminal providing power to a first phase winding of the three-phase power device;
   a second terminal connected between the second high side switching device and the second low side switching device, the second terminal providing power to a second phase winding of the three-phase power device; and
   a third terminal connected between the third high side switching device and the third low side switching device, the third terminal providing power to a third phase winding of the three-phase power device.

7. The printed circuit board of claim 1 wherein the first switching device is a first high side switching device, the second switching device is a second high side switching device, and the third switching device is a third high side switching device.

8. The printed circuit board of claim 7 wherein the common source node comprises a power source node.

9. The printed circuit board of claim 7 further having at least a first low side switching device, a second low side switching device, and a third low side switching device that are each mounted to a surface of the printed circuit board, the printed circuit board further comprising:
 a first terminal connected between the first high side switching device and the first low side switching device, the first terminal providing power to a first phase winding of the three-phase power device;
 a second terminal connected between the second high side switching device and the second low side switching device, the second terminal providing power to a second phase winding of the three-phase power device; and
 a third terminal connected between the third high side switching device and the third low side switching device, the third terminal providing power to a third phase winding of the three-phase power device.

10. The printed circuit board of claim 1 wherein the distance between the common source node and the first switching device is about twice the distance between the common source node and the second switching device.

11. The printed circuit board of claim 10 wherein the distance between the common source node and the third switching device is about twice the distance between the common source node and the second switching device.

12. A printed circuit board for a three-phase power device, the printed circuit board having at least a first low side switching device, a second low side switching device, a third low side switching device, and a current sensor that are each mounted to a surface of the printed circuit board, the printed circuit board comprising:
 a first set of conductive paths in a first layer of the printed circuit board that provides electrical conductivity between the first low side switching device, the second low side switching device, the third low side switching device, and the current sensor;
 a second set of conductive paths in a second layer of the printed circuit board that provides electrical conductivity between the first low side switching device, the third low side switching device, and the current sensor; and
 a plurality of vias that connect the first layer of the printed circuit board to the second layer of the printed circuit board;
 wherein a distance between the first low side switching device and the current sensor and a distance between the third low side switching device and the current sensor is greater than a distance between the second low side switching device and the current sensor.

13. The printed circuit board of claim 12 further comprising:
 a third set of conductive paths in a third layer of the printed circuit board that provides electrical conductivity between the first low side switching device and the third low side switching device; and
 a second plurality of vias that connect the first layer of the printed circuit board to the third layer of the printed circuit board.

14. The printed circuit board of claim 13 wherein a portion of the second plurality of vias is the same as the first plurality of vias.

15. The printed circuit board of claim 12 further having at least a first high side switching device, a second high side switching device, and a third high side switching device that are each mounted to a surface of the printed circuit board, the printed circuit board further comprising:
 a first terminal connected between the first high side switching device and the first low side switching device, the first terminal providing power to a first phase winding of the three-phase power device;
 a second terminal connected between the second high side switching device and the second low side switching device, the second terminal providing power to a second phase winding of the three-phase power device; and
 a third terminal connected between the third high side switching device and the third low side switching device, the third terminal providing power to a third phase winding of the three-phase power device.

16. The printed circuit board of claim 12 wherein the distance between the first low side switching device and the current sensor is about twice the distance between the second low side switching device and the current sensor.

17. The printed circuit board of claim 16 wherein the distance between the third low side switching device and the current sensor is about twice the distance between the second low side switching device and the current sensor.

18. The printed circuit board of claim 12 wherein the first low side switching device, the second low side switching device, and the third low side switching device are field effect transistors, each having a source terminal, a drain terminal, and a gate terminal.

19. The printed circuit board of claim 18 wherein a distance between the source terminal of the first low side switching device and the current sensor is about twice a distance between the source terminal of the second low side switching device and the current sensor, and a distance between the source terminal of the third low side switching device and the current sensor is about twice the distance between the source terminal of the second low side switching device and the current sensor.

20. A printed circuit board for a three-phase power device, the printed circuit board having a switching circuit and a current sensor mounted on a surface of the printed circuit board, the switching circuit having three sets of switching devices, each set of switching devices having a high side switching device and a low side switching device, the printed circuit board comprising:
 a first set of conductive paths in a first layer of the printed circuit board that provides electrical conductivity between each of the low side switching devices of the switching circuit and the current sensor;
 a second set of conductive paths in a second layer of the printed circuit board that provides electrical conductivity between at least two of the low side switching devices of the switching circuit and the current sensor; and
 a plurality of vias that connect the first layer of the printed circuit board to the second layer of the printed circuit board;
 wherein the second conductive paths assist in substantially balancing impedances between the low side switching devices of the switching circuit and the current sensor.

21. The printed circuit board of claim 20 further comprising:
 a third set of conductive paths in a third layer of the printed circuit board that provides electrical conductivity between at least two of the low side switching devices of the switching circuit; and a second plurality of vias that connect the first layer of the printed circuit board to the third layer of the printed circuit board.

22. The printed circuit board of claim 21 wherein a portion of the second plurality of vias is the same as the first plurality of vias.

23. The printed circuit board of claim 20 further comprising:

a first terminal connected between a first set of switching devices, the first terminal providing power to a first phase winding of the three-phase power device;

a second terminal connected between a second set of switching, the second terminal providing power to a second phase winding of the three-phase power device; and a third terminal connected between a third set of switching, the third terminal providing power to a third phase winding of the three-phase power device.

24. The printed circuit board of claim 20 wherein the distance between two of the low side switching devices of the switching circuit and the current sensor is about twice the distance between one of the low side switching devices of the switching circuit and the current sensor.

25. The printed circuit board of claim 20 wherein the low side switching devices of the switching circuit are field effect transistors, each having a source terminal, a drain terminal, and a gate terminal.

26. The printed circuit board of claim 25 wherein a distance between the source terminals of two of the low side switching devices of the switching circuit and the current sensor is about twice a distance between the source terminal of one of the low side switching devices of the switching circuit and the current sensor.

27. A printed circuit board for a three-phase power device, the printed circuit board having at least a first low side switching device, a second low side switching device, a third low side switching device, and a current sensor that are each mounted to a surface of the printed circuit board, the printed circuit board comprising:

a first set of conductive paths in a first layer of the printed circuit board that provides electrical conductivity between the first low side switching device, the second low side switching device, the third low side switching device, and the current sensor;

a second set of conductive paths in a second layer of the printed circuit board that provides electrical conductivity between the first low side switching device, the third low side switching device, and the current sensor;

a first set of vias that connect the first layer of the printed circuit board to the second layer of the printed circuit board;

a third set of conductive paths in a third layer of the printed circuit board that provides electrical conductivity between the first low side switching device and the third low side switching device; and a second set of vias that connect the first layer of the printed circuit board to the third layer of the printed circuit board.

28. The printed circuit board of claim 27 further having at least a first high side switching device, a second high side switching device, and a third high side switching device that are each mounted to a surface of the printed circuit board, the printed circuit board further comprising:

a first terminal connected between the first high side switching device and the first low side switching device, the first terminal providing power to a first phase winding of the three-phase power device;

a second terminal connected between the second high side switching device and the second low side switching device, the second terminal providing power to a second phase winding of the three-phase power device; and a third terminal connected between the third high side switching device and the third low side switching device, the third terminal providing power to a third phase winding of the three-phase power device.

29. The printed circuit board of claim 27 wherein the distance between the first low side switching device and the current sensor is about twice the distance between the second low side switching device and the current sensor.

30. The printed circuit board of claim 29 wherein the distance between the third low side switching device and the current sensor is about twice the distance between the second low side switching device and the current sensor.

31. The printed circuit board of claim 27 wherein the first low side switching device, the second low side switching device, and the third low side switching device are field effect transistors, each having a source terminal, a drain terminal, and a gate terminal.

32. The printed circuit board of claim 31 wherein a distance between the source terminal of the first low side switching device and the current sensor is about twice a distance between the source terminal of the second low side switching device and the current sensor, and a distance between the source terminal of the third low side switching device and the current sensor is about twice the distance between the source terminal of the second low side switching device and the current sensor.

33. The printed circuit board of claim 27 wherein a first portion of the first set of vias is positioned in proximity to the first low side switching device, a second portion of the first set of vias is positioned in proximity to the third low side switching device, and a third portion of the first set of vias is positioned in proximity to the current sensor.

34. The printed circuit board of claim 27 wherein a first portion of the second set of vias is positioned in proximity to the first low side switching device and a second portion of the second set of vias is positioned in proximity to the third low side switching device.

35. A printed circuit board for a three-phase power device, the printed circuit board having at least a power source node, a first high side switching device, a second high side switching device, and a third high side switching device that are each mounted to a surface of the printed circuit board, the printed circuit board comprising:

a first set of conductive paths in a first layer of the printed circuit board that provides electrical conductivity between the power source node, the first high side switching device, the second high side switching device, and the third high side switching device;

a second set of conductive paths in a second layer of the printed circuit board that provides electrical conductivity between the power source node, the first high side switching device, and the third high side switching device; and a plurality of vias that connect the first layer of the printed circuit board to the second layer of the printed circuit board;

wherein a distance between the power source node and the first high side switching device and a distance between the power source node and the third high side switching device is greater than a distance between the power source node and the second high side switching device.

36. The printed circuit board of claim 35 further comprising:
- a third set of conductive paths in a third layer of the printed circuit board that provides electrical conductivity between the first high side switching device and the third high side switching device; and
- a second plurality of vias that connect the first layer of the printed circuit board to the third layer of the printed circuit board.

37. The printed circuit board of claim 36 wherein a portion of the second plurality of vias is the same as the first plurality of vias.

38. The printed circuit board of claim 35 further having at least a first low side switching device, a second low side switching device, and a third low side switching device that are each mounted to a surface of the printed circuit board, the printed circuit board further comprising:
- a first terminal connected between the first high side switching device and the first low side switching device, the first terminal providing power to a first phase winding of the three-phase power device;
- a second terminal connected between the second high side switching device and the second low side switching device, the second terminal providing power to a second phase winding of the three-phase power device; and
- a third terminal connected between the third high side switching device and the third low side switching device, the third terminal providing power to a third phase winding of the three-phase power device.

39. The printed circuit board of claim 35 wherein the distance between the power source node and the first high side switching device is about twice the distance between the power source node and the second high side switching device.

40. The printed circuit board of claim 39 wherein the distance between the power source node and the third high side switching device is about twice the distance between the power source node and the second high side switching device.

41. The printed circuit board of claim 35 wherein the first high side switching device, the second high side switching device, and the third high side switching device are field effect transistors, each having a source terminal, a drain terminal, and a gate terminal.

42. The printed circuit board of claim 41 wherein a distance between the drain terminal of the first high side switching device and the power source node is about twice a distance between the drain terminal of the second high side switching device and the power source node, and a distance between the drain terminal of the third high side switching device and the power source node is about twice the distance between the drain terminal of the second high side switching device and the power source node.

* * * * *